US011508918B2

(12) United States Patent
Jiang

(10) Patent No.: US 11,508,918 B2
(45) Date of Patent: Nov. 22, 2022

(54) DISPLAY PANEL HAVING MOISTURE-BLOCKING STRUCTURE AND METHOD OF MANUFACTURING THE DISPLAY PANEL

(71) Applicant: Wuhan China Star Optoelectronics Semiconductor Display Technology Co., Ltd., Hubei (CN)

(72) Inventor: Qian Jiang, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 323 days.

(21) Appl. No.: 16/623,502

(22) PCT Filed: Oct. 30, 2019

(86) PCT No.: PCT/CN2019/114199
§ 371 (c)(1),
(2) Date: Dec. 17, 2019

(87) PCT Pub. No.: WO2021/017226
PCT Pub. Date: Feb. 4, 2021

(65) Prior Publication Data
US 2021/0359235 A1 Nov. 18, 2021

(30) Foreign Application Priority Data
Jul. 31, 2019 (CN) .......................... 201910700337.6

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3246* (2013.01); *H01L 27/3258* (2013.01); *H01L 51/5237* (2013.01); *H01L 51/56* (2013.01)

(58) Field of Classification Search
CPC ............. H01L 51/0097; H01L 27/3246; H01L 27/3258; H01L 51/5237; H01L 51/56
(Continued)

(56) References Cited

U.S. PATENT DOCUMENTS

2019/0305252 A1 10/2019 Dai et al.
2021/0257434 A1* 8/2021 Xie ..................... H01L 51/5253
2021/0343813 A1* 11/2021 Lee ..................... H01L 27/3262

FOREIGN PATENT DOCUMENTS

CN   108400152 A   8/2018
CN   109768188 A   5/2019
(Continued)

OTHER PUBLICATIONS

Chinese Office Action, National Intellectual Property Administration, People's Republic of China, Chinese Patent Application No. 201910700337.6, dated May 31, 2021, 13 pages.

Primary Examiner — Xia L Cross
(74) Attorney, Agent, or Firm — Taft Stettinius & Hollister LLP

(57) ABSTRACT

The disclosure provides a display panel and a method of manufacturing same. In the display panel, an organic light-emitting structural layer and an encapsulating structural layer are formed on a pixel defining layer and covers an entire surface of a through hole. The through hole is defined before the organic light-emitting structural layer and the encapsulating structural layer covers the surface of the through hole. Therefore, the encapsulating structural layer covers an interior lateral wall of the through hole, which prevents atmospheric moisture from invading into gaps
(Continued)

between layers of an OLED device from the through hole and eroding a metal layer and an organic light-emitting layer in a display region.

9 Claims, 6 Drawing Sheets

(51) Int. Cl.
    *H01L 51/52*     (2006.01)
    *H01L 51/56*     (2006.01)

(58) Field of Classification Search
    USPC ............................................. 257/40
    See application file for complete search history.

(56) References Cited

FOREIGN PATENT DOCUMENTS

| | | |
|---|---|---|
| CN | 109904346 A | 6/2019 |
| CN | 110021643 A | 7/2019 |
| CN | 110034241 A | 7/2019 |
| CN | 110034249 A | 7/2019 |

* cited by examiner

DISPLAY PANEL HAVING MOISTURE-BLOCKING STRUCTURE AND METHOD OF MANUFACTURING THE DISPLAY PANEL

CROSS-REFERENCE TO RELATED APPLICATIONS

This application is a U.S. National Phase of International PCT Application No. PCT/CN2019/114199 filed Oct. 30, 2019, which claims the benefit of Chinese Patent Application Serial No. 201910700337.6 filed Jul. 31, 2019, the contents of each application are incorporated herein by reference in their entirety.

FIELD

The present disclosure relates to the field of display technology and, more particularly, relates to a display panel and a method of manufacturing same.

BACKGROUND

In conventional organic light-emitting diode (OLED) devices, a through hole is necessary to be defined in an OLED panel to arrange and expose a camera.

However, in conventional process, the through hole is defined in the OLED panel after structural layers of the OLED panel are formed. Therefore, atmospheric moisture will enter into gaps between layers of the OLED device from the through hole and erode a metal layer and an organic light-emitting layer in a display region, thereby threatening lifetime of the OLED display panel.

SUMMARY

An embodiment of the present disclosure provides a display panel and a method of manufacturing same to solve a technical problem that atmospheric moisture will enter into gaps between layers of an OLED device from a through hole and erode a metal layer and an organic light-emitting layer in a display region in conventional OLED panels, which threatens lifetime of the OLED display panels.

An embodiment of the present disclosure provides a display panel, including a flexible substrate, and a thin film transistor (TFT) array structural layer, an organic light-emitting structural layer, and an encapsulating structural layer which are sequentially disposed on the flexible substrate. The display panel includes a through hole extending and passing through the TFT array structural layer and the flexible substrate.

The organic light-emitting structural layer and the encapsulating structural layer cover an interior lateral wall of the through hole.

The display panel further includes a barrier disposed on the TFT array structural layer and disposed around the through hole.

The barrier includes at least one first barrier and at least one second barrier. The second barrier is near the through hole. The first barrier is disposed on a side beside the second barrier and away from the through hole. The first barrier is configured to block the organic light-emitting structural layer.

A width of the first barrier gradually increases along a direction from an end of a vertical section of the first barrier near the flexible substrate to the other end of the vertical section of the first barrier away from the flexible substrate.

A width of the second barrier gradually decreases along a direction from an end of a vertical section of the second barrier near the flexible substrate to an end of the vertical section of the second barrier away from the flexible substrate.

In the display panel of the present disclosure, a distance between adjacent second barriers is greater than a height of the second barrier.

An embodiment of the present disclosure provides a method of manufacturing a display panel, including the following steps: providing a substrate, wherein the substrate includes at least one predetermined region in which a through hole is defined; defining at least one raised ring on the predetermined region in which a through hole is defined, and then forming a flexible substrate covering the raised ring on the substrate; forming a thin film transistor (TFT) array structural layer on the flexible substrate, wherein a through hole is defined on a portion of the TFT array structural layer corresponding to the predetermined region in which a through hole is defined; forming a pixel defining layer and a barrier on the TFT array structural layer, wherein the pixel defining layer and the barrier are disposed on a same layer, and the barrier is disposed around the through hole; cutting the flexible substrate along a direction where the raised ring extends, and then removing the flexible substrate disposed in the raised ring to make the through hole extend and pass through the flexible substrate; sequentially forming an organic light-emitting structural layer and an encapsulating structural layer on the pixel defining layer, wherein the organic light-emitting structural layer and the encapsulating structural layer cover an interior lateral wall of the through hole and a surface of the substrate corresponding to the through hole; and peeling the substrate to remove the layers covering the predetermined region in which a through hole is defined from the substrate.

In the method of the present disclosure, the raised ring includes a first raised ring and a second raised ring, and the flexible substrate includes a first substrate and a second substrate.

The step of defining at least one raised ring on the predetermined region in which a through hole is defined, and then forming a flexible substrate covering the raised ring on the substrate includes the following steps: defining a first raised ring on the predetermined region in which a through hole is defined; forming a first flexible substrate covering the first raised ring on the substrate; defining a second raised ring on the first flexible substrate; and forming a second flexible substrate covering the second raised ring on the first flexible substrate, wherein an orthographic projection of the second raised ring projected onto the substrate is surrounding an orthographic projection of the first raised ring projected onto the substrate.

In the method of the present disclosure, the through hole is defined in the TFT array structural layer by etching.

In the method of the present disclosure, the barrier includes at least one first barrier and at least one second barrier. The second barrier is near the through hole. The first barrier is disposed on a side beside the second barrier and away from the through hole. The first barrier is configured to block the organic light-emitting structural layer.

A width of the first barrier gradually increases along a direction from an end of a vertical section of the first barrier near the substrate to the other end of the vertical section of the first barrier away from the substrate.

A width of the second barrier gradually decreases along a direction from an end of a vertical section of the second barrier near the substrate to the other end of the vertical section of the second barrier away from the substrate.

In the method of the present disclosure, the amount of the second barrier is two, and a distance between adjacent second barriers is greater than a height of the second barrier.

In the method of the present disclosure, a step before cutting the flexible substrate along a direction where the raised ring extends, and then removing the flexible substrate in the raised ring to make the through hole extend through the flexible substrate further includes the following step: forming a protective photoresist layer on the pixel defining layer, wherein the photoresist layer covers the entire substrate. forming a protective photoresist layer on the pixel defining layer, wherein the photoresist layer covers the entire substrate.

In the method of the present disclosure, a step before forming an organic light-emitting structural layer on the pixel defining layer further includes the following step: removing the protective photoresist layer.

In the method of the present disclosure, the flexible substrate is cut under protective gas, wherein an exhaust gas extractor configured to extract dust and exhaust gas is disposed around a purge nozzle of a cutting machine.

In the method of the present disclosure, the encapsulating structural layer includes two non-organic encapsulating layers and an organic encapsulating layer disposed between the two non-organic encapsulating layers.

A step before peeling the substrate further includes the following step: cutting the non-organic encapsulating layer on the substrate corresponding to the predetermined region in which a through hole is defined.

In the method of the present disclosure, a width of the raised ring is same as a width of spot size of laser beam.

An embodiment of the present disclosure further provides a display panel, including a flexible substrate, and a thin film transistor (TFT) array structural layer, an organic light-emitting structural layer, and an encapsulating structural layer which are sequentially disposed on the flexible substrate. The display panel includes a through hole extending and passing through the TFT array structural layer and the flexible substrate.

The organic light-emitting structural layer and the encapsulating structural layer cover an interior lateral wall of the through hole.

In the display panel of the present disclosure, the display panel further includes a barrier disposed on a same layer as the pixel defining layer.

The barrier includes at least one first barrier and at least one second barrier. The second barrier is near the through hole. The first barrier is disposed on a side beside the second barrier and away from the through hole. The first barrier is configured to block the organic light-emitting structural layer.

A width of the first barrier gradually increases along a direction from an end of a vertical section of the first barrier near the flexible substrate to the other end of the vertical section of the first barrier away from the flexible substrate.

In the display panel of the present disclosure, a width of the second barrier gradually decreases along a direction from an end of a vertical section of the second barrier near the flexible substrate to the other end of the vertical section of the second barrier away from the flexible substrate.

In the display panel of the present disclosure, a distance between adjacent second barriers is greater than a height of the second barrier.

Compared to conventional display panels, a display panel and a method of manufacturing same provided by the present disclosure have the following advantages: First, a raised ring is provided to reduce thickness of a portion of a flexible substrate corresponding to the raised ring, thereby making a laser cutting plane flat, reducing thicknesses of layers, and preventing a periphery of the flexible substrate from curling.

Secondly, a through hole is defined in a portion of a TFT array structural layer corresponding to a predetermined region to reduce thicknesses of layers of the predetermined region and reduce dust and harmful gases generated from laser cutting process.

Thirdly, in the present disclosure, first the through hole is defined, then an encapsulating structural layer covers a surface of the through hole. Therefore, the encapsulating structural layer can cover an interior lateral wall of the through hole, which solves the technical problem that atmospheric moisture will enter into gaps between layers of an OLED device from the through hole and erode a metal layer and an organic light-emitting layer in a display region in conventional OLED panels, which threatens lifetime of the OLED display panels.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION

Figure 1:
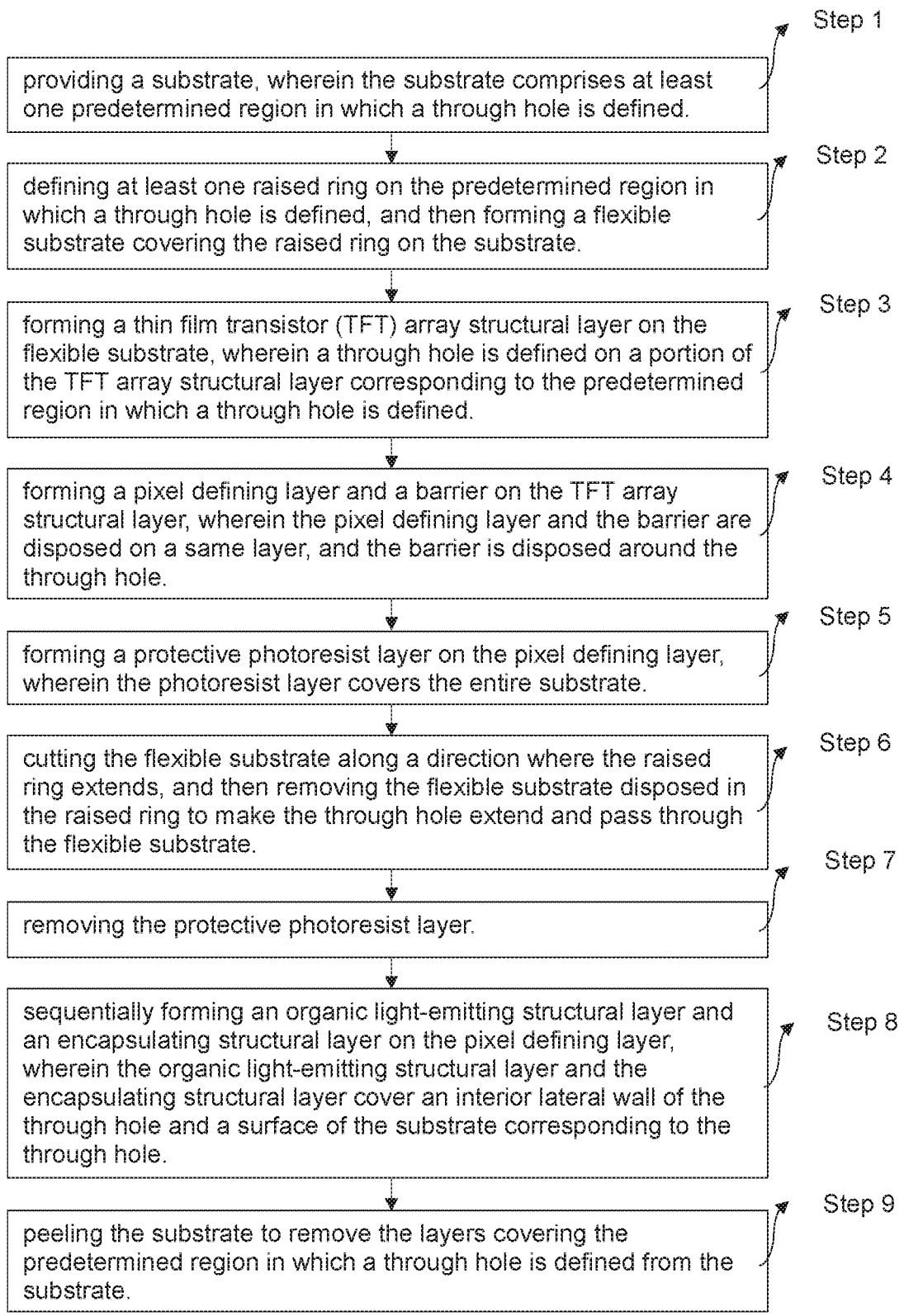
FIG. 1 is a schematic flowchart showing a method of manufacturing a display panel according to a first embodiment of the present disclosure.

Examples of the described embodiments are given in the accompanying drawings, wherein the identical or similar reference numerals constantly denote the identical or similar elements or elements having the identical or similar functions. The specific embodiments described with reference to the attached drawings are all exemplary and are intended to illustrate and interpret the present disclosure, which shall not be construed as causing limitations to the present disclosure.

Referring to FIG. 1, FIG. 1 is a schematic flowchart showing a method of manufacturing a display panel according to a first embodiment of the present disclosure. An embodiment of the present disclosure provides a method of manufacturing a display panel, including the following steps:

Step 1: providing a substrate, wherein the substrate includes at least one predetermined region in which a through hole is defined.

Step 2: defining at least one raised ring on the predetermined region in which a through hole is defined, and then forming a flexible substrate covering the raised ring on the substrate.

Step 3: forming a thin film transistor (TFT) array structural layer on the flexible substrate, wherein a through hole is defined on a portion of the TFT array structural layer corresponding to the predetermined region in which a through hole is defined.

Step 4: forming a pixel defining layer and a barrier on the TFT array structural layer, wherein the pixel defining layer and the barrier are disposed on a same layer, and the barrier is disposed around the through hole.

Step 5: forming a protective photoresist layer on the pixel defining layer, wherein the photoresist layer covers the entire substrate.

Step 6: cutting the flexible substrate along a direction where the raised ring extends, and then removing the flexible substrate disposed in the raised ring to make the through hole extend and pass through the flexible substrate.

Step 7: removing the protective photoresist layer.

Step 8: sequentially forming an organic light-emitting structural layer and an encapsulating structural layer on the pixel defining layer, wherein the organic light-emitting structural layer and the encapsulating structural layer cover an interior lateral wall of the through hole and a surface of the substrate corresponding to the through hole.

Step 9: peeling the substrate to remove the layers covering the predetermined region in which a through hole is defined from the substrate.

Detailed descriptions of the display panel according to a first embodiment of the present disclosure are described below:

Step 1: providing a substrate 11. The substrate 11 includes at least one predetermined region 11a in which a through hole 21 is defined. A through hole 21 of the display panel according to the first embodiment is defined in the predetermined region 11a in which a through hole 21 is defined. The substrate 11 is a rigid substrate such as a glass substrate. Then proceed to Step 2.

Step 2: defining at least one raised ring 12 on the predetermined region 11a in which a through hole 21 is defined, and then forming a flexible substrate 13 covering the raised ring 12 on the substrate 11.

Figure 2:
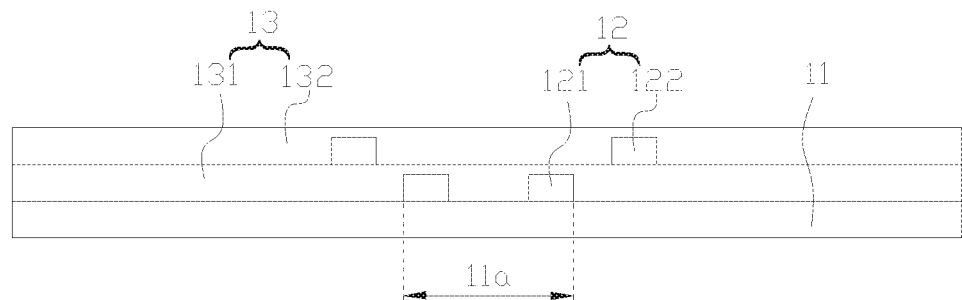
FIG. 2 is a schematic structural view showing the display panel after step 2 according to a first embodiment of the present disclosure.

Referring to FIG. 2, specifically, the raised ring 12 includes a first raised ring 121 and a second raised ring 122. The flexible substrate 13 includes a first substrate 131 and a second substrate 132.

The Step 2 further includes the following steps: defining a first raised ring 121 on the predetermined region 11a in which a through hole 21 is defined; forming a first flexible substrate 131 covering the first raised ring 121 on the substrate 11; defining a second raised ring 122 on the first flexible substrate 131; and forming a second flexible substrate 13 covering the second raised ring 122 on the first flexible substrate 131.

An orthographic projection of the second raised ring 122 projected onto the substrate 11 is surrounding an orthographic projection of the first raised ring 121 projected onto the substrate 11.

The first flexible substrate 131 and the second flexible substrate 132 are formed by coating process, which can thin a portion of layers of the flexible substrates corresponding to the first raised ring 121 and the second raised ring 122. Therefore, the number of flexible substrates to be cut can be reduced, and dust and exhaust gas generated from laser cutting process can be reduced, and a laser cutting plane can be flat. As a result, a periphery of the flexible substrates can be prevented from curling.

Further, a certain distance exists between the second raised ring 122 and the first raised ring 121 so that a later laser cutting operation can be carried out. The raised ring 12 can further be a cutting mark during laser cutting process, that is, laser cuts along a direction where the raised ring 12 extends. In other words, a width of the raised ring 12 is same as a width of spot size of laser beam.

In the first embodiment, laser cuts the second raised ring 122 first, then cuts the first raised ring 121 to form a through hole 21 extending and passing through the flexible substrate 13.

Preferably, material of the flexible substrate 13 is polyimide. Material of the raised ring 12 may be organic photoresist, Inorganic nitride, Inorganic oxide, or metal material.

Then proceed to Step 3.

Step 3: forming a TFT array structural layer 15 on the flexible substrate 13. The through hole 21 is defined in a portion of the TFT array structural layer 15 corresponding to the predetermined region 11a in which a through hole 21 is defined.

Furthermore, a planarization layer 14 is formed on the flexible substrate 13 before the Step 3. The TFT array structural layer 15 is disposed on the planarization layer 14.

Figure 3:
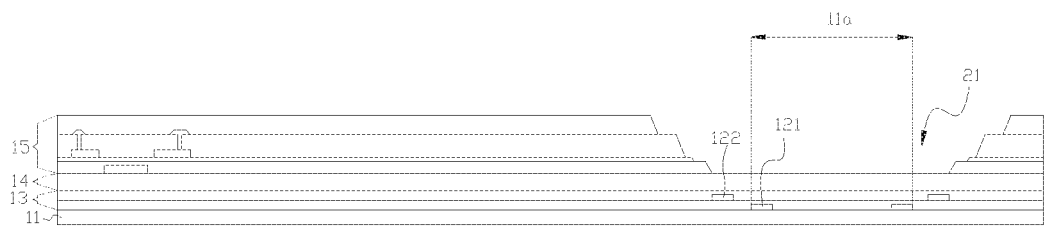
FIG. 3 is a schematic structural view showing the display panel after step 3 according to a first embodiment of the present disclosure.

Referring to FIG. 3, the TFT array structural layer 15 includes an active layer, a gate metal layer, a source/drain metal layer, a plurality of insulating layers disposed therebetween, and an interlayer dielectric layer disposed on the source/drain metal layer. The TFT array structural layer 15 is conventional technology which will not be described here.

In the first embodiment, the through hole 21 is defined in the TFT structural layer 15 by etching. In the above step of forming layers of the TFT array structural layer 15, layers (e.g., the gate insulating layer and the interlayer dielectric layer) that have microstructure such as patterns or openings corresponding to the predetermined region 11a in which a through hole 21 is defined can be patterned at the same time to form a film hole having a size close to that of the predetermined region 11a in which a through hole 21 is defined; layers (e.g., the insulating layer between the gate metal layer and the active layer) that do not have microstructure such as patterns or openings corresponding to the predetermined region 11a in which a through hole 21 is defined can be dry-etched to form a film hole having a size close to that of the predetermined region 11a in which a through hole 21 is defined.

Of course, in some embodiments, layers without microstructure such as patterns or openings may be stacked on the planarization layer 14.

In the present disclosure, the through hole 21 is defined in a TFT array structural layer 15, thereby reducing thicknesses of layers corresponding to the predetermined region 11a in which a through hole 21 is defined, and reducing dust and harmful gas generated from laser cutting process. Therefore, a later cutting operation can be carried out.

Then proceed to Step 4.

Step 4: forming a pixel defining layer 16 and a barrier 17 on the TFT array structural layer 15, wherein the pixel defining layer 16 and the barrier 17 are disposed on a same layer, and the barrier 17 is disposed around the through hole 21.

Figure 4:
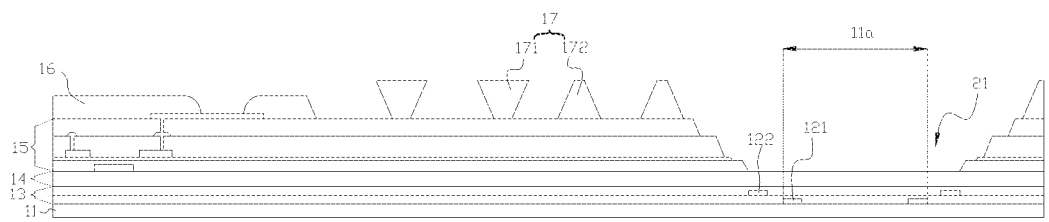
FIG. 4 is a schematic structural view showing the display panel after step 4 according to a first embodiment of the present disclosure.

Referring to FIG. 4, the barrier 17 includes a first barrier 171 and a second barrier 172. The second barrier 172 is near the through hole 21. The first barrier 171 is disposed on a side beside the second barrier 172 and away from the through hole 21. The first barrier 171 is configured to block an organic light-emitting structural layer 18.

A width of the first barrier 171 gradually increases along a direction from an end of a vertical section of the first barrier 171 near the substrate 11 to the other end of the vertical section of the first barrier 171 away from the substrate 11. Selectively, a vertical section of the first barrier 171 is an inverted trapezoid.

In the first embodiment, the amount of the second barrier 172 is two, and the amount of the first barrier 171 is two as well. Of course, the amount of the first barrier 171 and the second barrier 172 are not limited to the present disclosure.

A distance between adjacent second barriers 172 is greater than a height of the second barrier 172, which can ensure that a flat non-organic encapsulating 191 of an encapsulating structural layer 19 can be formed between adjacent second barriers 172 later.

The second barrier 172 has not only a function of preventing an organic encapsulating layer 192 of the encapsulating structural layer 19 from overflowing but a function of blocking the through hole 21 from a light-emitting pixel region. The light-emitting pixel region is a display region that emits light.

Furthermore, it should be noted, an anode is formed before the pixel defining layer 16 and the barrier 17 is formed. The anode is electrically connected to the TFT array structural layer 15. The pixel defining layer 16 is provided with an opening, and the opening exposes the anode.

Then proceed to Step 5.

Step 5: forming a protective photoresist layer 22 on the pixel defining layer 16, wherein the photoresist layer 22 covers the entire substrate 11.

Figure 5:
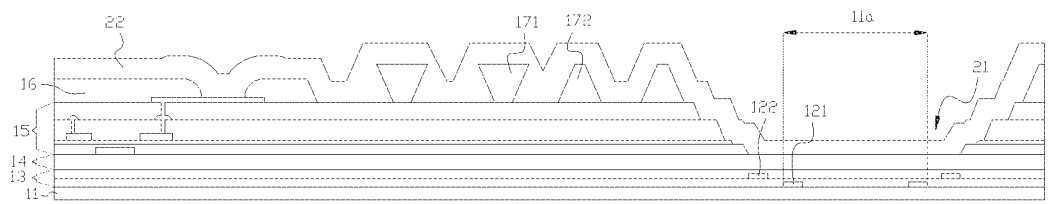
FIG. 5 is a schematic structural view showing the display panel after step 5 according to a first embodiment of the present disclosure.

Referring to FIG. 5, a protective photoresist layer 22 is configured to prevent large foreign matter particles or dust from falling on surfaces of layers on the substrate 11. Then proceed to Step 6.

Step 6: cutting the flexible substrate 13 along a direction where the raised ring 12 extends, and then removing the flexible substrate 13 disposed in the raised ring 12 to make the through hole 21 extend and pass through the flexible substrate 13.

Figure 6:
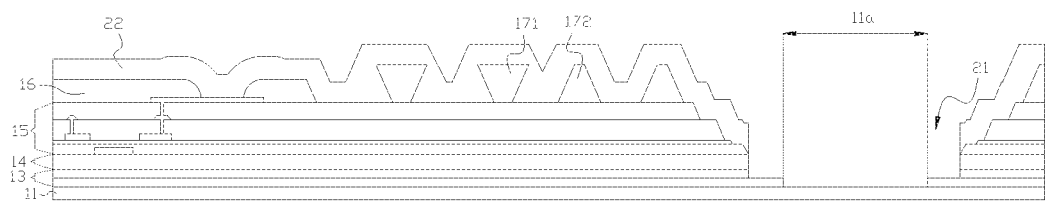
FIG. 6 is a schematic structural view showing the display panel after step 6 according to a first embodiment of the present disclosure.

Referring to FIG. 6, in the first embodiment, layers above the second raised ring 122 are cut along the second raised ring 122 by a cutting apparatus first. After layers that are cut are removed, layers above the first raised ring 121 are cut along the raised ring first raised ring 121 by a cutting apparatus. Then, layers that are cut are removed. Therefore, the through hole 21 can extend and pass through a planarization layer 14 and a flexible substrate 13 and expose the substrate 11.

Further, in the first embodiment, the flexible substrate 13 and the planarization layer 14 are cut under protective gas. An exhaust gas extractor configured to extract dust and exhaust gas is disposed around a purge nozzle of the cutting apparatus, thereby preventing dust generated from a cutting process from falling on surfaces of layers on the substrate 11.

Then proceed to Step 7.

Figure 7:
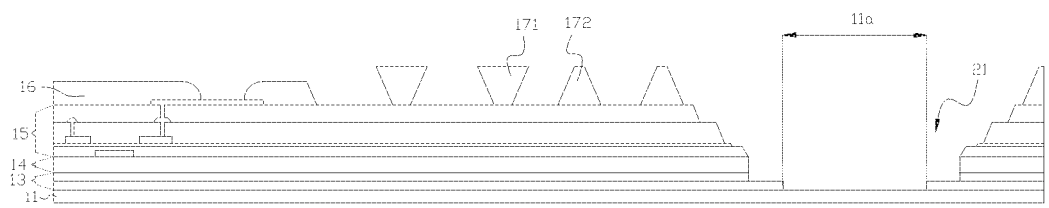
FIG. 7 is a schematic structural view showing the display panel after step 7 according to a first embodiment of the present disclosure.

Step 7: removing the protective photoresist layer 22. The protective photoresist layer 22 is removed by a deionization solution. Referring to FIG. 7. Then proceed to Step 8.

Step 8: sequentially forming an organic light-emitting structural layer 18 and an encapsulating structural layer 19 on the pixel defining layer 16, wherein the organic light-emitting structural layer 18 and the encapsulating structural layer 19 cover an interior lateral wall of the through hole 21 and a surface of the substrate 11 corresponding to the through hole 21.

Figure 8:
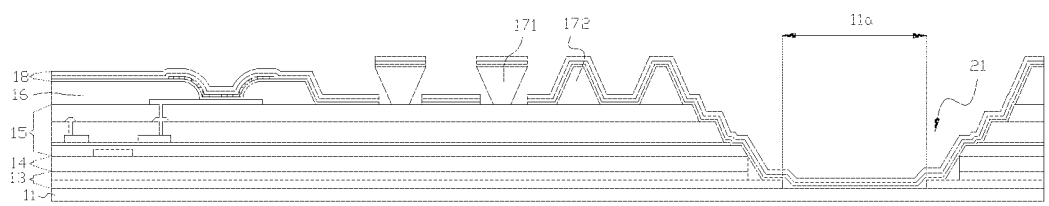
FIG. 8 is a schematic structural view showing the display panel after step 8 according to a first embodiment of the present disclosure.

Referring to FIG. 8, the organic light-emitting structural layer 18 includes a hole injection layer, a hole transport layer, a red light-emitting layer, a green light-emitting layer, a blue light-emitting layer, a hole blocking layer, an electron transport layer, an electron injection layer, and a cathode which are formed by deposition. The organic light-emitting structural layer 18 is conventional technology which will not be described here.

The organic light-emitting structural layer 18 is disposed on the anode and extends to the through hole 21. At a position of the first barrier 171, thickness of the light-emitting structural layer 18 is at the nanoscale level. Therefore, the light-emitting structural layer 18 can be cut and blocked by the first barrier 171.

Figure 9:
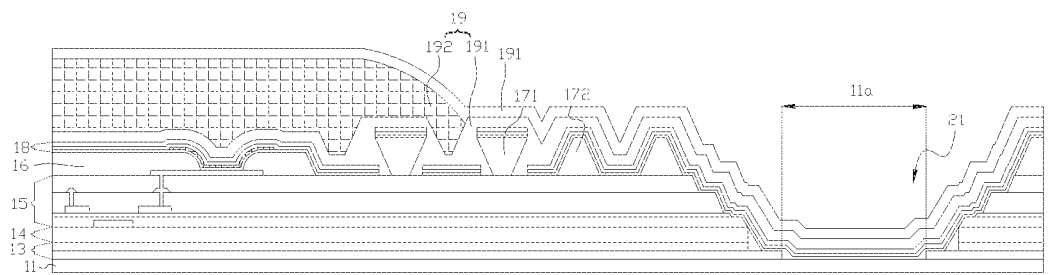
FIG. 9 is a schematic structural view showing the display panel after step 9 according to a first embodiment of the present disclosure.

Referring to FIG. 9, the encapsulating structural layer 19 includes two non-organic encapsulating layers 191 and an organic encapsulating layer 192 disposed between the two encapsulating layers 191. The two non-organic layer 191 cover layers disposed above the substrate 11. Thickness of the non-organic layer 191 usually ranges from 1 μm to 50 μm. The non-organic encapsulating layer 191 can normally cover the first barrier 171, the second barrier 172, and steps of multilayers in the through hole 21.

By the above arrangement, the organic light-emitting structural layer 18 and the encapsulating structural layer 19 can cover an interior lateral wall of the through hole 21, thereby preventing atmospheric moisture from invading into gaps between layers of an OLED device from the through hole 21 and eroding a metal layer and an organic light-emitting layer in a display region.

Furthermore, the organic encapsulating layer 192 is formed on the light-emitting pixel region by inkjet printing.

Then proceed to Step 9.

Step 9: peeling the substrate 11 to remove the layers covering the predetermined region 11a in which a through hole 21 is defined from the substrate 11.

Figure 10:
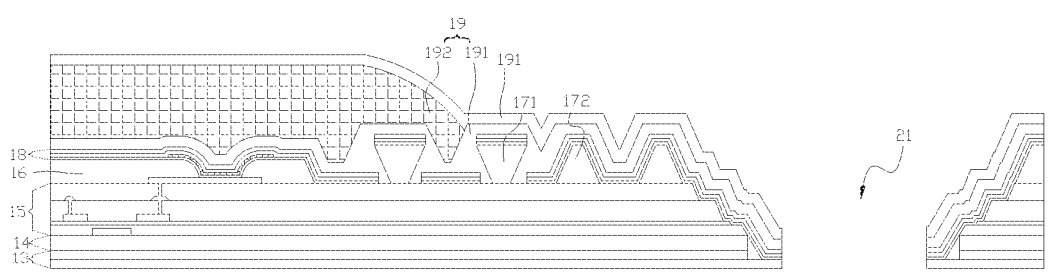
FIG. 10 is a schematic structural view showing the display panel after step 10 according to a first embodiment of the present disclosure.

Referring to FIG. 10, in the present embodiment, laser scans on a bottom side (substrate 11) of the display panel. Heat produced by the laser causes a top surface of the substrate 11 and a bottom surface of the flexible substrate 13 to separate from each other. In a peeling process, only a soft organic layer formed by deposition and a rigid non-organic encapsulating layer are disposed on the predetermined region 11a in which a through hole 21 is defined. Layers on the predetermined region 11a in which a through hole 21 is defined are peeled to form a flexible organic light-emitting display panel with a complete structure and a through hole.

The method of manufacturing a display panel according to a first embodiment is completed.

Figure 11:
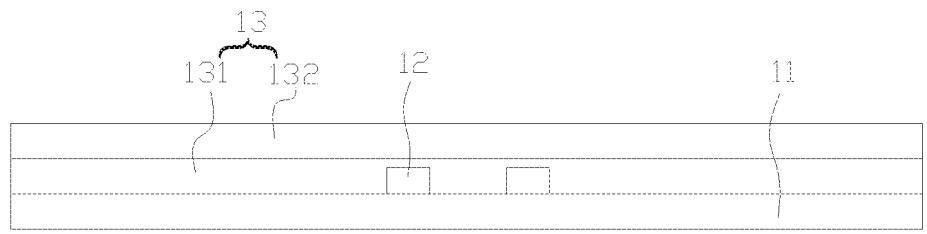
FIG. 11 is a schematic structural view showing the display panel after step 2 according to a second embodiment of the present disclosure.

In the method of manufacturing a display panel according to a second embodiment, differences between the second embodiment and the first embodiment is in the Step 2. Referring to FIG. 11, in the second embodiment, the flexible substrate 13 includes a first substrate 131 and a second substrate 132.

The step 2 of the second embodiment further includes the following steps: defining a raised ring 12 on the predetermined region 11a in which a through hole is defined; forming a first flexible substrate 131 covering the raised ring 12 on the substrate 11; and forming a second flexible substrate 132 on the first flexible substrate 131.

Figure 12:
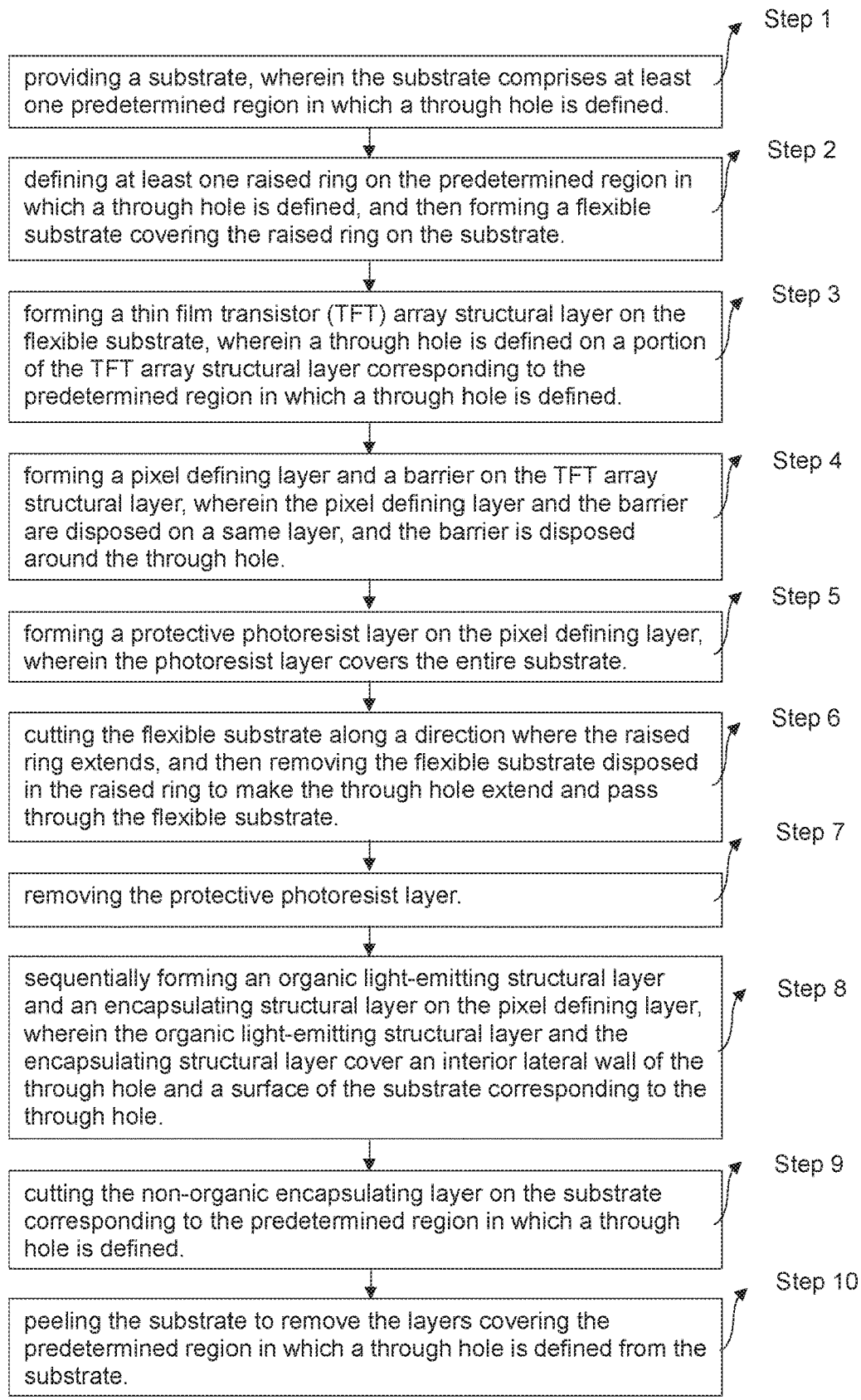
FIG. 12 is a schematic flowchart showing a method of manufacturing a display panel according to a third embodiment of the present disclosure.

Referring to FIG. 12, a method of manufacturing a display panel according to a third embodiment includes:

Step 1: providing a substrate 11, wherein the substrate 11 includes a predetermined region 11a in which a through hole is defined.

Step 2: defining a raised ring 12 on the predetermined region 11a in which a through hole 21 is defined, and then forming a flexible substrate 13 covering the raised ring 12 on the substrate 11.

Step 3: forming a thin film transistor (TFT) array structural layer 15 on the flexible substrate 13, wherein a through hole 21 is defined on a portion of the TFT array structural layer 15 corresponding to the predetermined region 11a in which a through hole 21 is defined.

Step 4: forming a pixel defining layer 16 and a barrier 17 on the TFT array structural layer 15, wherein the pixel defining layer 16 and the barrier 17 are disposed on a same layer, and the barrier 17 is disposed around the through hole 21.

Step 5: forming a protective photoresist layer 22 on the pixel defining layer 16, wherein the photoresist layer 22 covers the entire substrate 11.

Step 6: cutting the flexible substrate 13 along a direction where the raised ring 12 extends, and then removing the flexible substrate 13 disposed in the raised ring 12 to make the through hole 21 extend and pass through the flexible substrate 13.

Step 7: removing the protective photoresist layer 22.

Step 8: sequentially forming an organic light-emitting structural layer 18 and an encapsulating structural layer 19 on the pixel defining layer 16, wherein the organic light-emitting structural layer 18 and the encapsulating structural layer 19 cover an interior lateral wall of the through hole 21 and a surface of the substrate 11 corresponding to the through hole 21.

Step 9: cutting the non-organic encapsulating layer 191 on the substrate 11 corresponding to the predetermined region 11a in which a through hole 21 is defined.

Step 10: peeling the substrate 11 to remove the layers covering the predetermined region 11a in which a through hole 21 is defined from the substrate 11.

Compared to the first embodiment, the method of manufacturing a display panel according to a third embodiment of the present disclosure further includes the Step 9. The non-organic encapsulating layer 191 on the substrate 11 corresponding to the predetermined region 11a in which a through hole 21 is defined is cut by laser. Therefore, the non-organic encapsulating layer 191 can be prevented from extending to the second barrier 172 from cracks of the substrate 11.

Compared to the first embodiment, the method of manufacturing a display panel according to a fourth embodiment of the present disclosure may omit the step 5 and the step 7. As a result, manufacturing process can be simplified.

Figure 13:
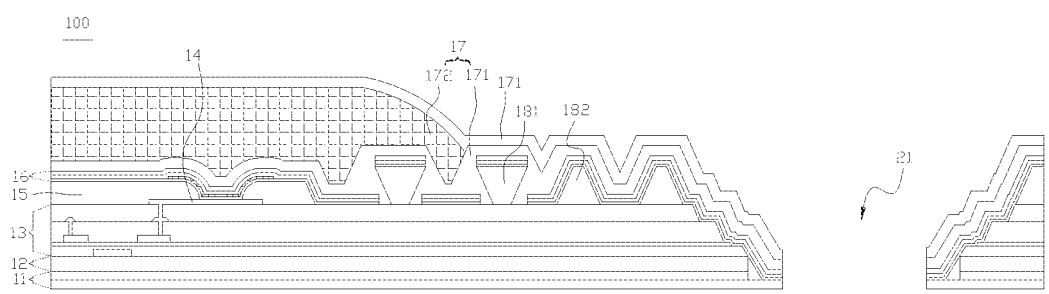
FIG. 13 is a schematic structural view showing the display panel according to an embodiment of the present disclosure.

Referring to FIG. 13, the present disclosure further provides a display panel 100. The display panel 100 includes a flexible substrate 11, and a planarization layer 12, a TFT array structural layer 13, an anode 14, a pixel defining layer 15, an organic light-emitting structural layer 16, and an encapsulating structural layer 17 which are sequentially disposed on the flexible substrate 11. The display panel 100 includes a through hole 21. The through hole 21 extends and passes through the TFT array structural layer 13, the flexible substrate 11, and the planarization layer 12.

The organic light-emitting layer 16 and the encapsulating structural layer 17 cover an interior lateral wall of the through hole 21.

In the display panel 100 of the present disclosure, the encapsulating structural layer 17 covers a surface of the through hole 21 and the interior lateral wall of the through hole 21, thereby preventing atmospheric moisture from invading into gaps between layers of an OLED device from the through hole 21 and eroding a metal layer and an organic light-emitting layer in a display region.

In the present embodiment, the display panel 100 further includes a barrier disposed on a same layer as the pixel defining layer 15.

The barrier includes a first barrier 181 and a second barrier 182. The second barrier 182 is near the through hole 21. The first barrier 181 is disposed on a side beside the second barrier 182 away from the through hole 21, and the first barrier 181 is configured to block an organic light-emitting structural layer 16.

A width of the first barrier 181 gradually increases along a direction from an end of a vertical section of the first barrier 181 near the flexible substrate 11 to the other end of the vertical section of the first barrier 181 away from the flexible substrate 11.

A width of the second barrier 182 gradually decreases along a direction from an end of a vertical section of the second barrier 182 near the flexible substrate 11 to the other end of the vertical section of the second barrier 182 away from the flexible substrate 11.

A distance between adjacent second barriers 182 is greater than a height of the second barrier 182.

In the present embodiment, a method of manufacturing a display panel may be any of the first to fourth embodiments. Specific contents may be referred to the above embodiments.

Compared to conventional display panels, the display panel and the method of manufacturing same provided by the present disclosure have the following advantages: First, a raised ring is provided to reduce thickness of a portion of a flexible substrate corresponding to the raised ring, thereby making a laser cutting plane flat, reducing thicknesses of layers that are cut, and preventing a periphery of the flexible substrate from curling.

Secondly, a through hole is defined in a portion of a TFT array structural layer corresponding to a predetermined region to reduce thicknesses of layers of the predetermined region and reduce dust and harmful gases generated from laser cutting process.

Thirdly, in the present disclosure, first the through hole is defined, then an encapsulating structural layer covers a surface of the through hole. Therefore, the encapsulating structural layer can cover an interior lateral wall of the through hole, which solves the technical problem that atmospheric moisture will enter into gaps between layers of an OLED device from the through hole and erode a metal layer and an organic light-emitting layer in a display region in conventional OLED panels, which threatens lifetime of the OLED display panels.

In summary, many changes and modifications to the described embodiment can be carried out by those skilled in the art, and all such changes and modifications are intended to be included within the scope of the appended claims.

What is claimed is:

1. A method of manufacturing a display panel, comprising following steps:
   providing a substrate, wherein the substrate comprises a predetermined region defined with a through hole;
   defining a raised ring on the predetermined region defined with the through hole, and then forming a flexible substrate covering the raised ring on the substrate;
   forming a thin film transistor (TFT) array structural layer on the flexible substrate, wherein the through hole is defined on a portion of the TFT array structural layer overlapping the predetermined region defined with the through hole;
   forming a pixel defining layer and a barrier on the TFT array structural layer, wherein the pixel defining layer and the barrier are disposed on a same layer, and the barrier is disposed around the through hole;
   cutting the flexible substrate along an extension direction of the raised ring, and then removing the flexible substrate disposed in the raised ring to make the through hole extend and pass through the flexible substrate;
   sequentially forming an organic light-emitting structural layer and an encapsulating structural layer on the pixel defining layer, wherein the organic light-emitting structural layer and the encapsulating structural layer cover an interior lateral wall of the through hole and a surface of the substrate overlapping the through hole; and
   peeling the substrate to remove the organic light-emitting structural layer and the encapsulating structural layer covering the predetermined region defined with the through hole from the substrate.

2. The method of claim 1, wherein the raised ring comprises a first raised ring and a second raised ring, and the flexible substrate comprises a first substrate and a second substrate; and
   wherein the step of defining the raised ring on the predetermined region defined with the through hole, and then forming the flexible substrate covering the raised ring on the substrate comprises following steps:
   defining the first raised ring on the predetermined region defined with the through hole;
   forming the first flexible substrate covering the first raised ring on the substrate;
   defining the second raised ring on the first flexible substrate; and
   forming the second flexible substrate covering the second raised ring on the first flexible substrate, wherein an orthographic projection of the second raised ring projected onto the substrate is surrounding an orthographic projection of the first raised ring projected onto the substrate.

3. The method of claim 1, wherein the barrier comprises first barriers and second barriers, the second barriers are near the through hole, the first barriers are disposed on a side beside the second barriers and away from the through hole, and the first barriers are configured to block the organic light-emitting structural layer;
   wherein a width of the first barriers gradually increases along a direction from an end of a vertical section of the first barriers near the flexible substrate to the other end of the vertical section of the first barriers away from the flexible substrate; and
   wherein a width of the second barriers gradually decreases along a direction from an end of a vertical section of the second barriers near the flexible substrate to the other end of the vertical section of the second barriers away from the flexible substrate.

4. The method of claim 3, wherein a distance between adjacent second barriers is greater than a height of the second barriers.

5. The method of claim 1, wherein the step of cutting the flexible substrate along the extension direction of the raised ring, and then removing the flexible substrate in the raised ring to make the through hole extend and pass through the flexible substrate comprises following step:
   cutting the flexible substrate under protective gas, wherein an exhaust gas extractor configured to extract dust and exhaust gas is disposed around a purge nozzle of a cutting machine.

6. The method of claim 1, wherein a step before cutting the flexible substrate along the extension direction of the raised ring, and then removing the flexible substrate in the raised ring to make the through hole extend and pass through the flexible substrate further comprises following step:
   forming a protective photoresist layer on the pixel defining layer, wherein the photoresist layer covers the entire substrate.

7. The method of claim 6, wherein a step before forming the organic light-emitting structural layer on the pixel defining layer further comprises following step:
   removing the protective photoresist layer.

8. The method of claim 1, wherein the encapsulating structural layer comprises two non-organic encapsulating layers and an organic encapsulating layer disposed between the two non-organic encapsulating layers;
   wherein a step before peeling the substrate further comprises following step:
   cutting the two non-organic encapsulating layers on the substrate overlapping the predetermined region defined with the through hole.

9. The method of claim 1, wherein a width of the raised ring is same as a width of spot size of laser beam used to cut the flexible substrate.

* * * * *